(12) United States Patent
Cargill et al.

(10) Patent No.: US 10,343,901 B2
(45) Date of Patent: Jul. 9, 2019

(54) MEMS TRANSDUCER HAVING STRESS DIFFUSING STRUCTURES PROVIDED IN A FLEXIBLE MEMBRANE

(71) Applicant: Cirrus Logic International Semiconductor Ltd., Edinburgh (GB)

(72) Inventors: Scott Lyall Cargill, Edinburgh (GB); Colin Robert Jenkins, Linlithgow (GB); Euan James Boyd, Edinburgh (GB); Richard Ian Laming, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/543,492

(22) PCT Filed: Jan. 25, 2016

(86) PCT No.: PCT/EP2016/051462
§ 371 (c)(1),
(2) Date: Jul. 13, 2017

(87) PCT Pub. No.: WO2016/120214
PCT Pub. Date: Aug. 4, 2016

(65) Prior Publication Data
US 2018/0002168 A1 Jan. 4, 2018

Related U.S. Application Data

(60) Provisional application No. 62/107,898, filed on Jan. 26, 2015.

(51) Int. Cl.
*B81C 1/00* (2006.01)
*H04R 19/00* (2006.01)
(Continued)

(52) U.S. Cl.
CPC ........ *B81C 1/00666* (2013.01); *B81B 3/0021* (2013.01); *B81B 3/0072* (2013.01);
(Continued)

(58) Field of Classification Search
CPC ... B81B 3/0021; B81B 3/0072; B81B 3/0075; B81B 2203/0127; B81B 2201/0257;
(Continued)

(56) References Cited

U.S. PATENT DOCUMENTS 6,168,906 B1 1/2001 Berstein et al.
2003/0057447 A1 3/2003 Saitoh et al.
(Continued)

FOREIGN PATENT DOCUMENTS

GB 2538828 A 11/2016
JP 2008167277 A 7/2008
(Continued)

OTHER PUBLICATIONS

Examination Report under Section 18(3), UKIPO, Application No. GB1601310.4, dated Jan. 18, 2018.
(Continued)

*Primary Examiner* — Md S Elahee
*Assistant Examiner* — Angelica M McKinney
(74) *Attorney, Agent, or Firm* — Jackson Walker L.L.P.

(57) ABSTRACT

The application describes MEMS transducer having a flexible membrane and which seeks to alleviate and/or redistribute stresses within the membrane layer. A membrane having a first/active region and a second/inactive region is described.

17 Claims, 8 Drawing Sheets

(51) Int. Cl.
*H04R 19/04* (2006.01)
*B81B 3/00* (2006.01)

(52) U.S. Cl.
CPC ....... *B81C 1/00182* (2013.01); *H04R 19/005* (2013.01); *H04R 19/04* (2013.01); *B81B 2201/0257* (2013.01); *B81B 2203/0127* (2013.01); *H01L 2224/16225* (2013.01); *H01L 2224/48091* (2013.01); *H01L 2224/48227* (2013.01); *H01L 2924/15151* (2013.01)

(58) Field of Classification Search
CPC ............ B81C 1/00666; B81C 1/00182; H01L 2224/16225; H04R 19/005; H04R 19/04
See application file for complete search history.

(56) References Cited

U.S. PATENT DOCUMENTS

| | | | | |
|---|---|---|---|---|
| 2003/0133588 | A1* | 7/2003 | Pedersen | B81B 3/0072 381/423 |
| 2005/0274191 | A1* | 12/2005 | Hasegawa | G01L 9/0055 73/721 |
| 2007/0201709 | A1* | 8/2007 | Suzuki | B81B 3/0072 381/174 |
| 2009/0060232 | A1 | 3/2009 | Hirade et al. | |
| 2009/0200620 | A1 | 8/2009 | Omura et al. | |
| 2010/0158279 | A1* | 6/2010 | Conti | H04R 7/24 381/174 |
| 2010/0158280 | A1 | 6/2010 | Coronato et al. | |
| 2011/0048138 | A1 | 3/2011 | Li | |
| 2011/0075865 | A1* | 3/2011 | Yang | H04R 19/005 381/174 |
| 2015/0145079 | A1 | 5/2015 | Dehe et al. | |
| 2015/0372454 | A1 | 12/2015 | Guilloy et al. | |
| 2016/0021459 | A1 | 1/2016 | Inoue et al. | |
| 2016/0037266 | A1 | 2/2016 | Uchida | |
| 2018/0002159 | A1 | 1/2018 | Cargill et al. | |

FOREIGN PATENT DOCUMENTS

| | | |
|---|---|---|
| WO | 2014045040 A | 3/2014 |
| WO | 2014141507 A1 | 9/2014 |
| WO | 2014141508 A1 | 9/2014 |

OTHER PUBLICATIONS

Combined Search and Examination Report under Sections 17 and 18(3), UKIPO, Application No. GB1601312.0, dated Aug. 1, 2016.
Combined Search and Examination Report under Sections 17 and 18(3), UKIPO, Application No. GB1601310.4, dated Sep. 21, 2016.
International Search Report and Written Opinion of the International Searching Authority, International Application No. PCT/EP2016/051462.
Examination Report, UKIPO, Application No. GB1601312.0, dated Apr. 18, 2018.
First Office Action, China National Intellectual Property Administration, Patent Application No. 201680007276X, dated Mar. 28, 2019.
First Office Action, China National Intellectual Property Administration, Patent Application No. 201680007276X2016800079862, dated Mar. 28, 2019.

* cited by examiner

MEMS TRANSDUCER HAVING STRESS DIFFUSING STRUCTURES PROVIDED IN A FLEXIBLE MEMBRANE

This invention relates to micro-electro-mechanical system (MEMS) devices and processes, and in particular to a MEMS device and process relating to a transducer, for example a capacitive microphone.

Various MEMS devices are becoming increasingly popular. MEMS transducers, and especially MEMS capacitive microphones, are increasingly being used in portable electronic devices such as mobile telephone and portable computing devices.

Microphone devices formed using MEMS fabrication processes typically comprise one or more membranes with electrodes for read-out/drive deposited on the membranes and/or substrate. In the case of MEMS pressure sensors and microphones the read out is usually accomplished by measuring the capacitance between the electrodes. In the case of output transducers, the membrane is moved by electrostatic forces generated by varying a potential difference applied across the electrodes.

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 103 is mechanically coupled to the flexible membrane, and together they form a first capacitive plate of the capacitive microphone device. A second electrode 102 is mechanically coupled to a generally rigid structural layer or back-plate 104, which together form a second capacitive plate of the capacitive microphone device. In the example shown in FIG. 1a the second electrode 102 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110.

A plurality of holes, hereinafter referred to as bleed holes 111, connect the first cavity 109 and the second cavity 110.

A further plurality of holes, hereinafter referred to as acoustic holes 112, are arranged in the back-plate 104 so as to allow free movement of air molecules through the back plate, such that the second cavity 110 forms part of an acoustic volume with a space on the other side of the back-plate. The membrane 101 is thus supported between two volumes, one volume comprising cavities 109 and substrate cavity 108 and another volume comprising cavity 110 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the back-plate may be arranged in the front volume, so that incident sound reaches the membrane via the acoustic holes 112 in the back-plate 104. In such a case the substrate cavity 108 may be sized to provide at least a significant part of a suitable back-volume.

In other applications, the microphone may be arranged so that sound may be received via the substrate cavity 108 in use, i.e. the substrate cavity forms part of an acoustic channel to the membrane and part of the front volume. In such applications the back-plate 104 forms part of the back-volume which is typically enclosed by some other structure, such as a suitable package.

It should also be noted that whilst FIG. 1 shows the back-plate 104 being supported on the opposite side of the membrane to the substrate 105, arrangements are known where the back-plate 104 is formed closest to the substrate with the membrane layer 101 supported above it.

In use, in response to a sound wave corresponding to a pressure wave incident on the microphone, the membrane is deformed slightly from its equilibrium position. The distance between the lower electrode 103 and the upper electrode 102 is correspondingly altered, giving rise to a change in capacitance between the two electrodes that is subsequently detected by electronic circuitry (not shown). The bleed holes allow the pressure in the first and second cavities to equalise over a relatively long timescales (in acoustic frequency terms) which reduces the effect of low frequency pressure variations, e.g. arising from temperature variations and the like, but without significantly impacting on sensitivity at the desired acoustic frequencies.

One skilled in the art will appreciate that MEMS transducers are typically formed on a wafer before being singulated. Increasing it is proposed that at least some electronic circuitry, e.g. for read-out and/or drive of the transducer, is also provided as part of an integrated circuit with the transducer. For example a MEMS microphone may be formed as an integrated circuit with at least some amplifier circuitry and/or some circuitry for biasing the microphone. The footprint of the area required for the transducer and any circuitry will determine how many devices can be formed on a given wafer and thus impact on the cost of the MEMS device. There is therefore a general desire to reduce the footprint required for fabrication of a MEMS device on a wafer.

In addition to be suitable for use in portable electronic devices such transducers should be able to survive the expected handling and use of the portable device, which may include the device being accidentally dropped.

If a device such as a mobile telephone is subject to a fall, this can result not only in a mechanical shock due to impact but also a high pressure impulse incident on a MEMS transducer. For example, a mobile telephone may have a sound port for a MEMS microphone on one face of the device. If the device falls onto that face, some air may be compressed by the falling device and forced into the sound port. This may result in a high pressure impulse incident on the transducer. It has been found that in conventional MEMS transducers high pressure impulses can potentially lead to damage of the transducer.

To help prevent any damage which may be caused by these high pressure impulses it has been proposed that the MEMS transducer could be provided with variable vents which can provide a flow path between the front and back volumes that has a size that can vary in use. In a high pressure situation the variable vent(s) provide a relatively large flow path between the volumes so as to provide for relatively rapid equalisation between the volumes, reducing the extent and/or duration of a high pressure event on the membrane. At lower pressures however, within the expected normal operating range of the transducer, the size of the flow path, if any, is smaller.

The variable vent structure thus acts as a type of pressure relief valve to reduce the pressure differential acting on the membrane at relatively high pressure differentials. However unlike, the bleed holes which may be present in the membrane which have a fixed area and thus a fixed size of flow path, the variable vent has a flow path size which varies in response to a pressure differential. Thus the degree to which the variable vent allows venting depends on the pressure differential acting on the vent—which clearly depends on the pressure of at least one of the first and second volumes. The variable vent therefore provides a variable acoustic impedance.

One proposed variable vent structure has a moveable portion which is moveable so as to open a hole extending between the volumes on either side of the membrane. FIGS. 2a and 2b illustrate such a known variable vent structure. FIG. 2a illustrates the flexible membrane 101 of a transducer such as described above in relation to FIGS. 1a and 1b (the rest of the transducer structure being omitted for clarity). The membrane is supported between a first volume, which includes cavity 109, and a second volume which typically includes cavity 110. As described above the membrane will typically have a plurality of bleed holes 111 which are dimensioned and arranged to produce a tuned effect on the transducer and reduce the impact of low frequency pressure variations. However such bleed holes are designed to have a limited impact on dynamic pressure variations at the acoustic frequencies of interest and thus provide very limited response to sudden high pressure events.

The transducer structure of FIG. 2a thus also includes variable vent structures 201 formed, as illustrated by FIG. 2b, by movable portions 202 which are movable with respect to a hole, in this case a hole through the membrane 101. The moveable portion 202 is arranged to occupy at least some, and possibly most, of the area of the hole at equilibrium pressure, i.e. when the first and second volumes are at substantially the same pressure. The moveable portion is moveable in response to a local pressure differential across the hole (i.e. between the front and back volume and thus across the membrane) so as to vary the size of the hole which is open to provide a flow path and hence the varying the extent to which the vent allows for pressure equalisation between the volumes. In other words the moveable portion may, in equilibrium, effectively close at least part of the hole, but is moveable so as to vary to degree to which the hole is closed.

The moveable portion 202 may be defined by etching one or more channel 203 through the membrane material 101 such that the moveable portion is attached to the rest of the membrane 101 by one or more connection points 204 such that the moveable portion can be deflected from the rest of the membrane. The vent may be configure such that the moveable portion 202 is not substantially deflected, and thus remains closing the hole, at pressure differentials that are within the normal expected operating range of the MEMS transducer but to move to increase the size of the flow path, e.g. close less of the hole, at higher pressure differentials that could potentially cause damage to the membrane.

The top part of FIG. 2a illustrates the flexible membrane 101 in normal operation where the pressure in the second volume 110 is greater than the pressure in the first volume. The membrane 101 is thus deflected downwards from the membrane equilibrium position. However the pressure differential is within the normal expected operating range of the device, i.e. below an operating threshold, and thus the moveable potions 202 of the variable vents 201 remain substantially closed. The lower part of FIG. 2 illustrates that the moveable portion 202 has been deflected from the rest of the membrane to expose the hole in the membrane and thus provide a flow path through the membrane. FIG. 2a illustrates two moveable portions of the membrane forming variable vent structures 201 but it will be appreciated that there may be more such vents in practice.

Such variable vent structures can thus be very useful for providing MEMS transducers, especially microphones, that can better survive high pressure events. Care does however need to be taken over the design of the variable vents, especially when formed in the membrane of the transducer. With the known variable vents there is typically a compromise between high-pressure relief and performance at acoustic pressures, in that if the vent opens to readily the acoustic performance of the transducer may be degraded but if the vent is too hard to open it may not provide sufficient extra flow during a high pressure event. Flow can be increased by increasing the number of vents but this can degrade the performance of the membrane or result in increased stress concentrations in areas of the membrane if too many vents are formed in the membrane itself. The vents could be formed in alternatively flow paths, e.g. through side wall structures, but this typically adds the size and cost of the transducer structure, which can increase the area required for the transducer chip.

It will be appreciated that the membrane layer of a MEMS transducer. A material is said to be under stress when its atoms are displaced from their equilibrium positions due to the action of a force. Thus, a force that increases or decreases the interatomic distance between the atoms of the membrane layer gives rise to stress within the membrane. For example, the membrane layer exhibits an inherent, or intrinsic, residual stress when at equilibrium (i.e. when no or negligible differential pressure arises across the membrane). Furthermore, stresses can arise in the membrane layer e.g. due to the way in which the membrane is supported in a fixed relation to the substrate or due to an acoustic pressure wave incident on the membrane.

MEMS transducers according to the present invention are intended to respond to the acoustic pressure waves which manifest as transient stress waves on the membrane surface. Thus, it will be appreciated that the stresses exhibited within a membrane layer when at equilibrium may potentially have a detrimental impact on the performance of a transducer.

Embodiments of the present invention are generally concerned with improving the efficiency and/or performance of a transducer structure. Aspects of the present invention are also concerned with alleviating and/or redistributing stresses within the membrane layer.

According to an aspect of the present invention there is provided a MEMs transducer comprising a membrane supported relative to a substrate, the membrane comprising a central region and plurality of stress distributing arms which extend laterally from the central region.

Preferably, the stress distributing arms serve to support the membrane layer in a fixed relation to the substrate. Preferably, each stress distributing arm comprises one or more mount structures which support the membrane layer in a fixed relation to the substrate. Thus, the membrane may be mounted directly or indirectly to the substrate by means of the one or more mounting portions provided on each of the stress distributing arms. Preferably, the mounting portions are provided at or near the periphery of the membrane layer.

The location of the mounting portions may effectively define a boundary of the membrane layer.

The stress distributing arms are preferably disposed and/or configured so as to provide a controlled distribution of stress within the membrane. In a preferred embodiment the stress distributing arms are disposed relative to the central region of the membrane such that the stress distribution across the membrane, or at least across the central region of the membrane, is substantially even, or varies in a controlled way. The stress distribution arms are preferably disposed at regular distance intervals around the central region of the membrane. This arrangement can alleviate the occurrence of regions of stress concentration particularly within the central region of the membrane where the electrode is typically coupled and, thus, where sensing (i.e. movement of the membrane) takes place.

According to one example, the membrane may be generally square, or rectangular in shape and one of a plurality of stress distribution arms may extend outwardly from the central region towards a peripheral corner of the membrane. Proximate to the peripheral corner, the stress distributing arms is provided with one or more mounting structures which effectively define a boundary edge of the membrane.

The membrane may be disposed above a substrate of the transducer such that the central region of the membrane substantially overlies a cavity of the substrate.

The membrane comprising a central region and one or more stress distributing arms may be considered to form a first region of the membrane. The membrane may also comprise at least one second region which may be separated from the first region by means of one or more channels.

According to another aspect of the invention there is provided a MEMS transducer comprising a membrane having a first membrane region and a second membrane region, wherein the first membrane region is separated from the second membrane region by one or more channels. The first membrane region may comprise a central region and plurality of support arms which extend laterally from the central region, each support arm having one or more mounting portions which support the membrane layer in a fixed relation to the substrate. The support arms are also arranged and/or configured such that the stress distribution arising in the membrane at equilibrium is controlled. Preferably, the support arms are arranged and/or configured so as to minimise/alleviate the occurrence of any stress concentrations within the central region of the membrane, particular in the vicinity of the centre of the membrane. The second membrane region of the membrane may be disposed at the periphery of the membrane in the region between two adjacent stress distribution arms.

The first region may be considered to comprise an "active region" of the membrane. Thus, the membrane comprising a central region and one or more stress distribution arms may be considered to be the first, or active, region of a membrane. Furthermore, the second region may be considered to comprise an "inactive region" of the membrane. The first/active region can be considered to be the region of the transducer membrane that is used for sensing and/or is "dynamic". The second/inactive region of the membrane which is separated from the first/active region by a channel, can be considered to be non-dynamic in the sense that any movement of this part of the membrane is negligible. For example, in the case of a microphone device comprising a MEMS transducer according to an aspect of the present invention, the movement of the first/active region in response to an acoustic stimulus, e.g. sound waves entering the volume adjacent the membrane, is measured. The transducer may comprise first and second electrodes, one of which is coupled to the first, or active, region of the membrane—and the capacitance between the electrodes is measured to sense or measure the acoustic stimulus.

Thus, the MEMs transducer may further comprise an electrode coupled to the first/active region of the membrane.

The second/inactive region of the membrane will still act as an acoustic barrier between the front and back volumes of a MEMs transducer. Thus, there are advantages associated with the provision of the second/inactive area as part of the MEMS transducer. However, the movement of the second/inactive region (which will be zero or negligible) is not measured.

According to the present invention there is provided a MEMS transducer comprising: a membrane layer comprising:
an active membrane region, the active region comprising a plurality of arms for supporting the active membrane region; and
a plurality of regions of inactive membrane material which is not directly connected to the active membrane region.

The first and/or second region of the membrane may be provided with at least one vent structure having a moveable portion which deflects in response to a pressure differential across the vent structure to provide a flow path through the membrane. Preferably, the first region is provided with fewer vent structures than the second region.

The first and/or second region of the membrane may be provided with one or more bleed holes. Preferably, the first region is provided with fewer bleed holes than the second region.

Preferably, the membrane comprising the first and second membrane regions is non-circular in shape. Thus, the membrane may be generally square or rectangular in shape. The membrane may be composed of four sides. Alternatively, the membrane may have a polygon shape.

According to another aspect there is provided a wafer comprising at least one transducer embodying any aspect of the present invention. Thus, a wafer may comprise at least one MEMS transducer having a membrane supported relative to a substrate, the membrane comprising a central region and plurality of stress distribution arms which extend laterally from the central region, each stress distribution arm having one or more mounting portions which support the membrane layer in a fixed relation to the substrate.

Preferably the wafer is a silicon wafer and comprises a transducer area where transducers are provided on the wafer. It is typical for the transducer area of a silicon wafer to be square or rectangular in shape. As a result of the shape of the membrane, which according to preferred embodiments may preferably be generally square or rectangular, the transducer may be based on a design that utilises a generally rectangular or square membrane area. This is particularly advantageous when fabricating a silicon wafer having one or more MEMS transducers, since it will be appreciated that such a design requires less area for a given transducer sensitivity than an equivalent circular design.

Aspects of the present invention are also directed to alleviating and/or diffusing and/or redistributing stress arising in the membrane in the region of the mounting structures which serve to support the position of a membrane in fixed relation to the substrate.

According to another aspect of the invention there is provided a MEMS transducer comprising a membrane and at least one mount structure for supporting the membrane relative to a substrate to provide a flexible membrane, and further comprising one or more stress diffusing structures provided in said membrane so as to diffuse stress in the region of the mount structure.

The stress diffusing, or redistributing, structure may comprise a slit which extends through the membrane. The slit may be curved or arcuate in form. Thus, the slit may be C-shaped or U-shaped and may curve through at least 180 degrees to define a mouth, or opening, between the ends of the slit. The stress diffusing structure advantageously serves to change the local stress distribution arising within the membrane in a controlled way. Preferably the stress diffusing slit is provided proximate to the mount structure such that the mouth of the curved slit faces away from the boundary defined by the, or each, mount structures and is separated from the region of the mount structure by the slit. In this way, simulations of preferred embodiments of the present invention have demonstrated that stress within the membrane that arises at or near the mounting structure is channelled around the curve of the slit and concentrated either side of the curve. Membrane stress within the bounding portion of the curve is also shown to be reduced. Preferably a plurality of stress diffusing structures are provided in a row. In this example simulations show a series of stress concentration regions arising between adjacent stress diffusing structures and a series of reduced stress regions within the bounding portion of the stress diffusing structures. Controlling the stress in tis way has been demonstrated to improve the sensitivity of the membrane. In particular, according to some examples, stress is shown to be more evenly distributed at the central region of the membrane. Compliance and/or flexibility of the membrane is enhanced.

Whilst the slit will effectively separate a portion of the membrane from the rest of the membrane, the slit is dimensioned such that the portion of the membrane defined by the slit does not act as a flap that deforms due to a pressure differentially across the membrane. Thus, the portion within the bounding curve of the slit exhibits minimal deflection away from the plane of the membrane in response to a differential pressure across the membrane.

According to a further aspect of the present invention there is provided a MEMS transducer comprising a membrane supported relative to a substrate, the membrane comprising a central region and plurality of stress distribution arms which extend laterally from the central region, wherein each stress distribution arm comprises one or more mount structures which support the membrane layer relative to the substrate and wherein one or more stress diffusing structures are provided so as to diffuse stress in the region of the mount structures.

In general there is provided a MEMS transducer having a flexible membrane comprises at least one stress redistribution feature. The MEMs transducer may be a capacitive microphone. The flexible membrane may be supported between a first volume and a second volume and a vent structure may be provided to allow a flow path between the first and second volumes. The vent structure may comprise a moveable portion which is moveable so as to open a hole extending from the first volume to the second volume. The moveable portion may quiescently occupy at least some, and possibly most, of the area of the hole, but is moveable in response to a local pressure differential across the hole so as to vary the size of the hole which is open to provide a flow path. In other words the moveable portion may, in equilibrium, effectively close at least part of the hole, but is moveable so as to vary to degree to which the hole is closed. The moveable portion is preferably arranged to remain closing the hole, i.e. aperture, at normal operating pressure differentials but to more to increase the size of the flow path, e.g. close less of the hole, at higher pressure differentials that could potentially cause damage to the membrane. The vent can therefore be seen as a variable aperture.

The vent structure thus acts as a type of pressure relief valve to reduce the pressure differential acting on the membrane. However unlike, the bleed holes in the membrane (if present) which have a fixed area and thus a fixed size of flow path, the variable vent has a flow path size, i.e. aperture, which varies in response to a pressure differential. Thus the degree to which the vent allows venting depends on the pressure differential acting on the vent—which clearly depends on the pressure of at least one of the first and second volumes. The vent structure therefore provides a variable acoustic impedance.

The transducer may comprise a back-plate structure wherein the flexible membrane layer is supported with respect to said back-plate structure. The back-plate structure may comprises a plurality of holes through the back-plate structure.

The transducer may be a capacitive sensor such as a microphone. The transducer may comprise readout, i.e. amplification, circuitry. The transducer may be located within a package having a sound port, i.e. an acoustic port. The transducer may be implemented in an electronic device which may be at least one of: a portable device; a battery powered device; an audio device; a computing device; a communications device; a personal media player; a mobile telephone; a tablet device; a games device; and a voice controlled device.

Features of any given aspect may be combined with the features of any other aspect and the various features described herein may be implemented in any combination in a given embodiment.

Associated methods of fabricating a MEMS transducer are provided for each of the above aspects.

For a better understanding of the present invention, and to show how it may be put into effect, reference will now be made, by way of example to the accompanying drawings, in which:

FIG. 3b illustrates a variation on the transducer structure shown in FIG. 3a;

DESCRIPTION

In transducers such as described above in relation to FIGS. 1a and 1b the membrane layer be formed from a material such as silicon nitride and may be deposited to be have residual stress inherent in the membrane at equilibrium. The membrane is thus formed so as to be supported around substantially the whole of its periphery. The membrane can therefore be thought of as being under tension, akin to a drum skin stretched over a frame. To provide uniform behaviour and even stress distribution the membrane is thus typically formed as a generally circular structure.

Figure 1A:
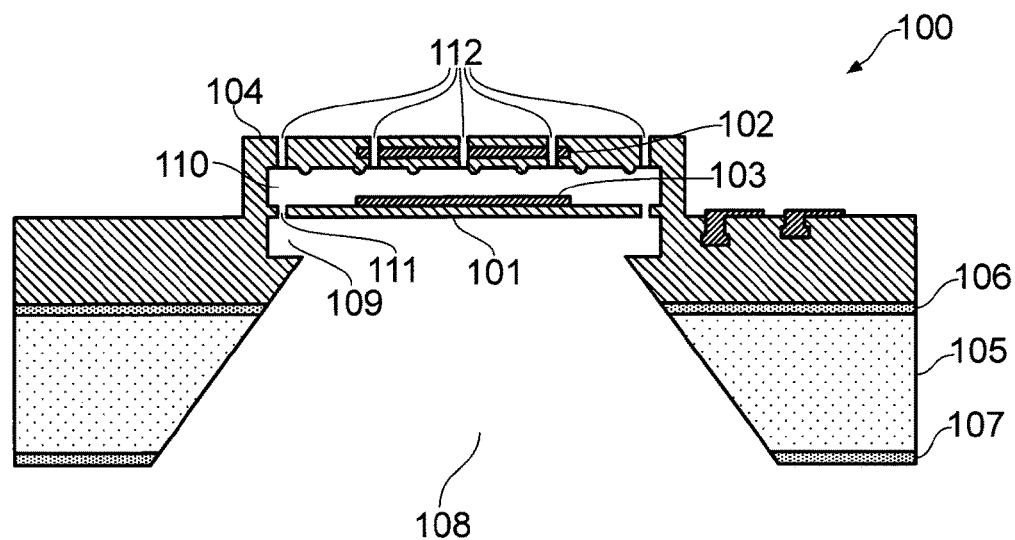
FIGS. 1a and 1b illustrate sectional and perspective views of a known MEMS microphone structure.

For instance to form the transducer structure illustrated in FIG. 1a one or more base layers may be formed on the substrate 105 and then a layer of sacrificial material may be deposited and patterned to form a generally circular shape. The sacrificial material serves to define the space that will form cavity 109. One or more layers may then be deposited on the sacrificial material to form the membrane 101. The bleed holes 111 may be formed in the membrane layer along with any vent structures such as described with reference to FIG. 2a or 2b. A further sacrificial material layer may then be deposited on top of the membrane and patterned to define cavity 110. The back plate layers can then deposited. To form the substrate cavity 108 a back etch may be performed. To ensure that it is the sacrificial material that defines cavity 109 and not the bulk back etch (which would be less accurate) it is ensured that the opening of the substrate cavity is smaller than cavity 109 and located within the area of the cavity 109. The sacrificial material can then be removed to leave cavities 109 and 110 and release the membrane. The membrane layer(s) thus extend into the side wall structure that also supports the back-plate. The flexible membrane itself is supported and constrained on all sides and is substantially circular in shape.

Whilst this type of process produces good device properties the use of circular membranes tends to result in some inefficiency in the use of the silicon wafer.

For various reasons it is most usual and/or cost effective to process areas of silicon in generally rectangular blocks of area. Thus the area on a silicon wafer that is designated for the MEMS transducer is typically generally square or rectangular in shape. This area needs to be large enough to encompass the generally circular transducer structure. This tends to be inefficient in terms of use of the silicon wafer as the corner regions of this designated transducer area are effectively unused. This limits the number of transducer structures and circuits that can be fabricated on a given wafer. It would of course be possible to fit more transducers on a wafer by reducing the size of the transducer but this would have any impact on resulting sensitivity and thus is undesirable.

In some embodiments therefore the transducer is based on a design that more efficiency utilises a generally rectangular or square area. This design requires less area for a given transducer sensitivity than an equivalent circular design.

Figure 3A:
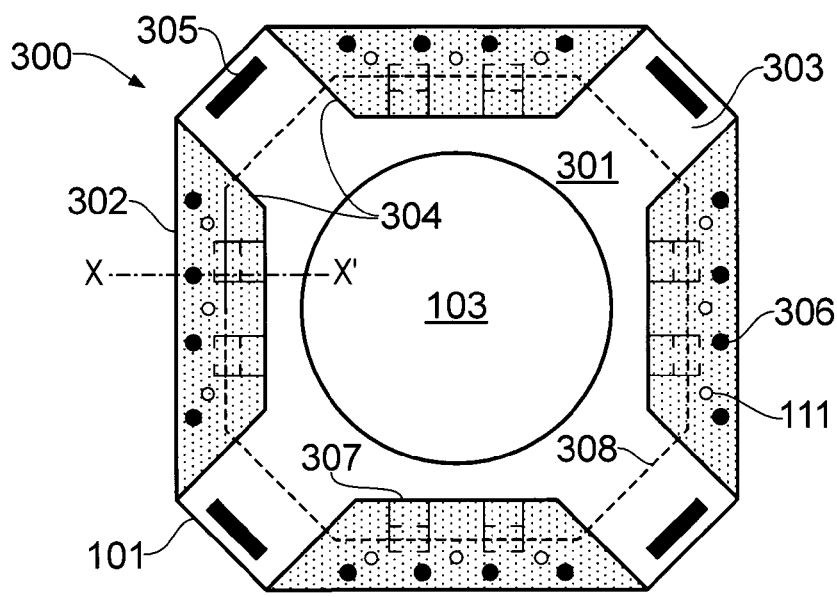
FIG. 3a illustrates a transducer structure according to an embodiment of the invention.

FIG. 3a illustrates an example of a transducer 300 according to an embodiment of the invention. FIG. 3a illustrates the transducer membrane 101 and thus represents a section through the transducer although the backplate may have substantially the same shape. The membrane is not substantially circular and instead, in this example, has a polygon shape. In general the membrane has a shape that would substantially fill a square area defined by the perimeter of the membrane. In other words if one were to consider the smallest possible square area that would completely contain the membrane 101 then the membrane would cover a large proportion of such an area, for example the membrane may cover at least 90% of such a square area. It will be appreciated that for a circular membrane of diameter D the smallest such square area would have a side D. The area of the circle ($\pi.D^2/4$) would thus cover about 78% of the area of such a square ($D^2$).

The whole area illustrated in FIG. 3a is provided with a layer of membrane material. However in the example illustrated in FIG. 3a the layer of membrane material is divided into a first membrane region 301, which will be referred to herein as an active membrane region or just as active membrane, and a plurality of second regions 302 which will be referred to as inactive membrane regions or inactive membrane. The inactive membrane regions 302 are illustrated by the shaded regions in FIG. 3a, with the unshaded area corresponding to the active membrane 301.

The active membrane thus a central area, e.g. where the membrane electrode 103 will be located, which is supported by a plurality of arms 303. In some embodiments the arms may be distributed substantially evenly around the periphery of the membrane. A generally even distribution of arms may help avoid unwanted stress concentration. In the example illustrated in FIG. 3 there are four arms 303 and thus four separate regions of inactive membrane 302, but it will be appreciated that there may be more or fewer arms in other embodiments, although preferably there will be at least three arms.

Figure 3B:
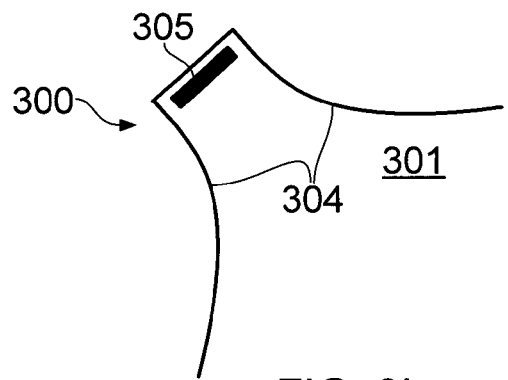

There are thus one or more channels or gaps 304 between the material of the active membrane 301 and the inactive membrane regions 302. Conveniently during manufacture a continuous layer of membrane material may be deposited and then the channels 304 may be etched through the membrane material to form the active and inactive regions. The channel may be shaped such that the side edges of the arms exhibit a smooth, or continuous, profile rather than being formed of one or more straight lines. This is illustrated in FIG. 3b.

Each arm 303 of the active membrane region 301 may comprise at least one mount 305 for supporting the membrane layer of the active region 301 with respect to the substrate and also possibly a backplate. There may also be mounts 306 within the inactive membrane regions for supporting the inactive membrane region.

The mounts 305 and 306 may take various forms. For instance the mount could comprise a sidewall of the transducer structure and the membrane layer may extend into the sidewall. In some examples however the mount may be region where the membrane material makes contact with the substrate or a support structure that rises from the substrate. The mount may also comprise an area where the backplate are a support structure for the backplate makes contact with the membrane. The membrane at the mount is thus effectively held in place and prevented from any substantial movement with respect to the substrate and/or backplate.

The material of the membrane layer can thus be deposited within intrinsic stress as described previously. The plurality of arms of the active region 301 all radiate generally away from the centre of the active membrane and thus can act to keep the membrane effectively in tension. As mentioned the arms may be evenly spaced around the active membrane. In addition the mounting points for the active membrane 301, e.g. mounts 305 may all be substantially equidistant from the centre of the active membrane—even with a generally square membrane layer. This is possible because the membrane material at the 'sides' of the square arrangement have been separated into inactive membrane regions that are not directly connected to the active membrane region. This arrangement thus means that the distribution of stress in the active membrane is generally even, both at equilibrium and when the active membrane is deflected by an incident pressure stimulus. The active membrane will thus behave in a similar way to a circular membrane which is constrained all around its periphery. This would not be the case were a square membrane, or the polygon membrane illustrated in FIG. 3a, bounded on all sides.

Such a design is advantageous as it provides an active membrane area that has a similar response to a circular membrane with a radius equal to the distance between the centre of the active membrane and the mounts 305 of the arms. However to fabricate such a corresponding circular membrane transducer would require a larger rectangular area of the substrate. By using a design such as illustrated in FIG. 3a the area required for the transducer on a wafer may therefore be reduced compared to a circular membrane of similar performance.

In general therefore in some embodiments of the present invention a MEMS transducer may comprise a membrane layer formed into an active membrane region, the active region comprising a plurality of arms for supporting the active membrane region. The arms may be substantially evenly spread around the periphery of the active membrane. The membrane layer may also comprise a plurality of regions of inactive membrane material which is not directly connected to the active membrane region. The arms of the active membrane region may comprise one or more mounts, the mounts of each arm being substantially equidistant from the centre of the active membrane. The active membrane may be under intrinsic stress.

It will be appreciated by one skilled in the art that various designs of MEMS transducer with a diaphragm with a central portion supported by arms have been proposed before. However in such known designs the diaphragm is not generally under intrinsic stress and often the purpose of such arms is to reduce stress—whereas in the embodiment illustrated in FIG. 3a the arms maintain the intrinsic stress in the active membrane.

Further such known designs do not include areas of inactive membrane. In the design of examples of the present invention substantially the whole of an area defined by the mounts 305 comprises membrane material. In other words if one were to define a shape by drawing straight lines between the mounts 305 of adjacent arms then substantially all the area of such a shape would comprise membrane material, i.e. active membrane material or inactive membrane material. For example at least 90% of the area defined by mounts 305 or at least 95% of the area defined by mounts 305 would comprise membrane material. In the design of FIG. 3a the only part of this area that does not comprise membrane material is the bleed holes 111 and the channels 304 (together with any channels for vents 307 as will be discussed below).

Preferably the gap between the active and inactive regions may be relatively small, i.e. just sufficient to separate the regions, e.g. of the order of a few microns or so. Thus, at equilibrium position the active region may lie in plane with the inactive regions of the membrane. Thus the only significant flow path between the front and back volume of the transducer at equilibrium may be through any bleed holes 111 provided for low frequency pressure equalisation.

In response to an incident pressure stimulus the active membrane will be deflected, in a similar fashion to the conventional membrane discussed above. It will be appreciated that the inactive regions of the membrane may not be deflected to the same extent and thus as the active membrane moves there may be a small flow channel that opens up between the active and inactive regions of the membrane. Such a flow channel may be relatively small however and the increased acoustic conductance may be limited and thus the effect on the transducer performance may also be limited. The effect of any flow between the active and inactive regions of the membrane can be taken into account when designing the transducer and for instance the number of bleed holes 111.

As mentioned above the whole transducer structure may have the general shape illustrated in FIG. 3a. In particular the backplate may be the same general shape as the illustrated membrane. The backplate may be supported above the membrane by supports at the mounting points 305 and/or 306 and the outer edges of the backplate may not extend substantially beyond the edges of the layer of membrane material. As mentioned this can be advantageous for fabricating multiple transducers, possibly along with associated electronic circuitry on a wafer.

Figure 4:
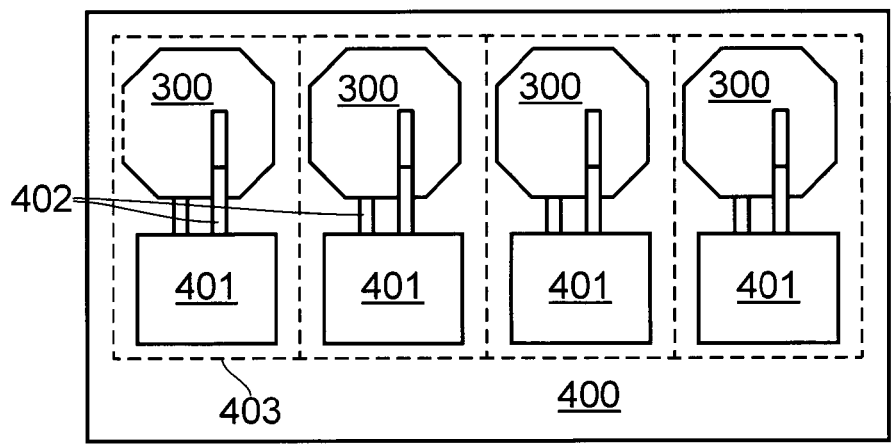
FIG. 4 illustrate formation of multiple transducers on a wafer.

FIG. 4 illustrates at least part of a wafer 400 having a plurality of transducers 300 fabricated thereon. The wafer may 400 may be a wafer that has been processed to produce multiple devices and prior to singulation. In this example each transducer has associated region of circuitry 401. The region of circuitry may comprise circuitry for operation and/or readout of the transducer. For instance the circuitry may comprise a voltage biasing circuit such as a charge pump. Additionally or alternatively the readout circuitry may comprise amplifier circuitry such as a low noise amplifier or other readout or signal processing circuitry. The transducer 300 will be connected to the circuitry by conductive paths 402, which may typically be at least partly buried under various other layers such as passivation layers. The circuitry area may include contact regions for making electrical connections in use.

It can be seen that the transducer 300 and circuitry 401 fit into a fabrication area 403 and make effective use of the fabrication area. Thus the area of a wafer may be used more efficiently, i.e. to produce a greater number of transducers than would otherwise have been the case using a circular transducer design but without any significant loss in sensitivity of the resulting transducers.

Figure 2A:
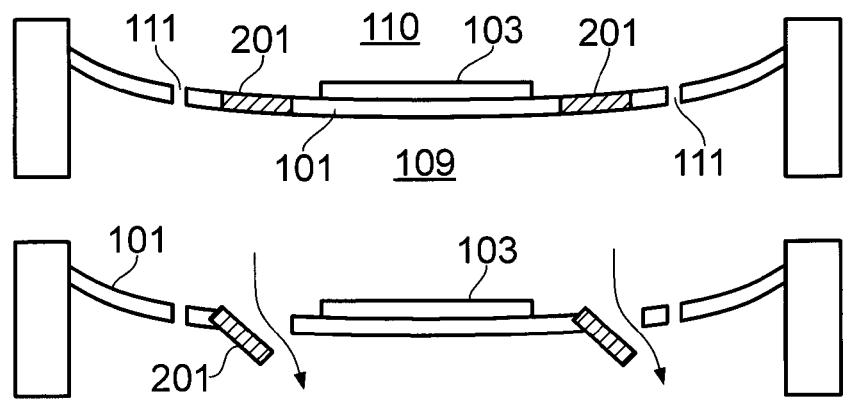
FIGS. 2a and 2b illustrate one example of known variable vents.
Figure 2B:
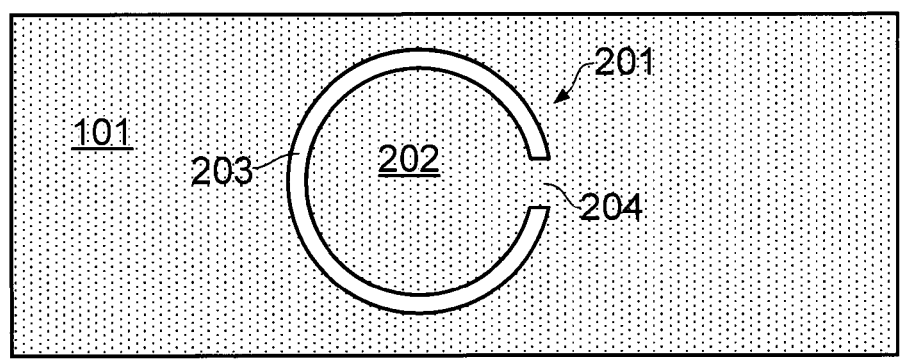

As mentioned above it has been proposed to use variable vents, for instance such as those illustrated with respect to FIGS. 2a and 2b, in a MEMS transducer structure to act as a type of pressure relief valve in high pressure situations, the vent opening to provide a larger flow path at high pressure differentials but having a smaller, if any, flow path at the pressure differentials within the normal operating range of the MEMS transducer. The vent structure is thus designed to be substantially closed in a first range of pressure differentials which corresponds to a normal range of operating pressure differentials for the transducer but to be open at a second, higher range of pressure differential to allow relatively significantly increased flow. Note that the closed position does not necessarily correspond to no flow and could correspond to defines flow path size desired for normal operation, e.g. to provide at least some low frequency equalisation in the first range of pressure differentials. WO2014/045040 describes a number of different variable vent designs that may be used.

Referring back to FIG. 3a as noted above the movement of the active membrane 301 with respect to the inactive membrane regions 302 may provide some limited degree of venting between volumes on either side of the membrane, e.g. a front and back volume. This may provide some limited venting in a high pressure situation. However it may be beneficial to provide some variable vents 307 for venting in a high pressure situation and/or for providing a tuned sensitivity response as described above.

In some embodiments at least one variable vent 307 may be located in the inactive membrane region 302. In some embodiments the majority or substantially all of any variable vents 307 present may be located in inactive membrane regions 302. Additionally or alternatively some, a majority or substantially all of the bleed holes 111 may be located in inactive regions of membrane.

Figure 1B:
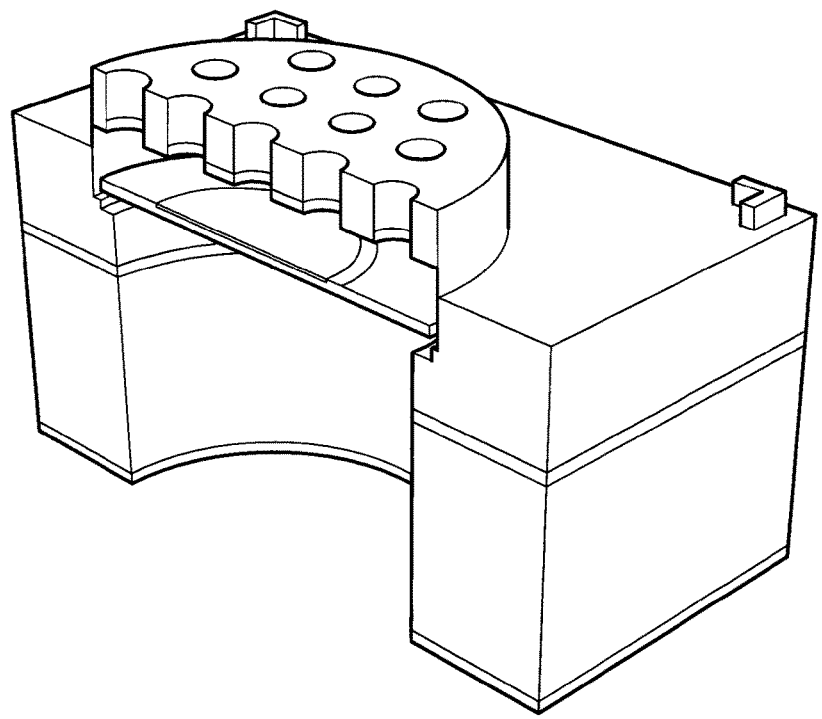

As discussed above in a conventional MEMS microphone transducer such as described with reference to FIGS. 1a and 1b the membrane layer is generally a substantially uniform circular membrane which is supported around substantially the entire periphery. In such a conventional design the whole of the membrane layer within the periphery defined by the supports is effectively active membrane. Any variable vents formed in the membrane are thus formed in the active membrane.

This means that the size, shape and location of the vents need to be carefully controlled. If there are too many vents in the membrane the presence of the vents, which are formed by etching through the membrane, can alter the stress in the membrane and degrade the overall performance. If the vents are not placed correctly with respect to other membrane features and/or each other, or again if there are too many vent structures then the result may be concentrate stress in a part of the membrane in an undesirable way, especially for a membrane with intrinsic stress such as described above. However if there are too few vents or they are too small then benefits provided may the vents may be minimised and there may not be sufficient increase in flow through the membrane in a high pressure situation to prevent damage.

In an embodiment such as described with reference to FIG. 3a the membrane layer is divided into an active region 301 which is used for sensing and also a plurality of inactive regions 302. The inactive regions 302 comprise membrane material and continue to act as an acoustic barrier between the front and back volumes of the transducer. Variable vents 307 can therefore be placed in the inactive region(s) as illustrated in FIG. 3a. Such a vent structure can operate, for example as described in WO2014/045040, to provide a flow path with a variable size that varies with pressure differential across the membrane and can, for instance, open at high pressure differentials to provide a significant additional flow path for venting between the volumes. However as the vent structures are formed in the inactive regions 302 of the membrane the presence (or absence) of the vent structures has no impact on the stress of the active part of the membrane, i.e. active membrane region 301. Thus there may be more freedom over the design of size and spacing of the variable vent structures than for vents formed in the active membrane. There is no restriction on the size of an individual vent, other than the usual concerns about the size of the channels defining the vent and their effect on low frequency roll off for example, and thus the vents may be larger than would be case for vents formed in the active membrane.

In addition if the variable vent structure is formed in the inactive membrane 302 then there may be one or more additional materials coupled to the membrane at that location so as to tailor the properties of the variable vent, for example the flexibility or stress handling capability, without impacting on the performance of the active membrane 301.

FIG. 3a therefore illustrates that each inactive membrane region 302 may be provided with one or more variable vents 307. The variable vent may have any suitable structure. For example the variable vents 307 may have a structure according to any of the variants described in WO2014/045040, the contents of which are hereby incorporated by reference.

However with at least some known variable vent designs it can be difficult to achieve the correct balance between the vent remaining sufficiently closed within the normal operating range of the device so as to have minimal impact on the operation of the transducer, for instance the acoustic sensitivity of a MEMS microphone, whilst also opening to a sufficient extent in the high pressure situations to provide sufficient venting.

Some embodiments of the present invention thus make use of variable vents with improved operating characteristics and/or which can provide a more tuned response to a given pressure differential.

In some embodiments therefore a variable vent structure may comprises at least one moveable portion which is moveable to provide a flow path that varies in size with pressure differential across the membrane material. The moveable portion may have at least first and second sections or segments where the first section of the vent is moveable with respect to the second portion of the vent. In other words both the first and second sections of the moveable portion may be deflected away from an equilibrium position but in addition the second section of the moveable portion may be deflected away from the first section of the moveable portion. The first section may be coupled to the second section via a living hinge formed from the material of the moveable portion. Thus, rather than be arranged as essentially a single flap as with the variable vent described with respect to FIG. 2b, the moveable portion of embodiments of the invention may have at least two flap portions.

The moveable portion may be arranged with respect to a vent hole to at least partly act as a vent cover and at least partially block the vent hole at equilibrium position. In some embodiments the vent hole may be formed in the membrane layer of the transducer. The moveable portion acts as a moveable vent cover and may be deflected away from its equilibrium position by a sufficient local pressure differential across the cover. The first section of the moveable cover may be coupled to a side wall of the vent hole, e.g. the surrounding membrane material, such that the first section can be deflected, for instance rotationally deflected, from the equilibrium position. The first section may therefore be effectively hingedly coupled to the side of wall of the vent hole. The second section may be coupled, for instance articulated, to the first section so that the second section can be rotationally deflected with respect to the first section. The second section may therefore be effectively hingedly coupled to the first section. The second section may only be connected to side wall of the vent hole via the first section and thus its possible movement may be fully defined by the connection to the first section.

Providing a moveable portion as a vent cover, where the moveable portion or cover comprises at least two sections, where the second section is able to move with respect to the first section and where the movement of the second section may be wholly defined by its connection to the first section is advantageous as it allows the opening of the vent to be tuned more readily to a desired characteristic and can provide a better profile of acoustic conductance with applied pressure differential.

Figure 5:
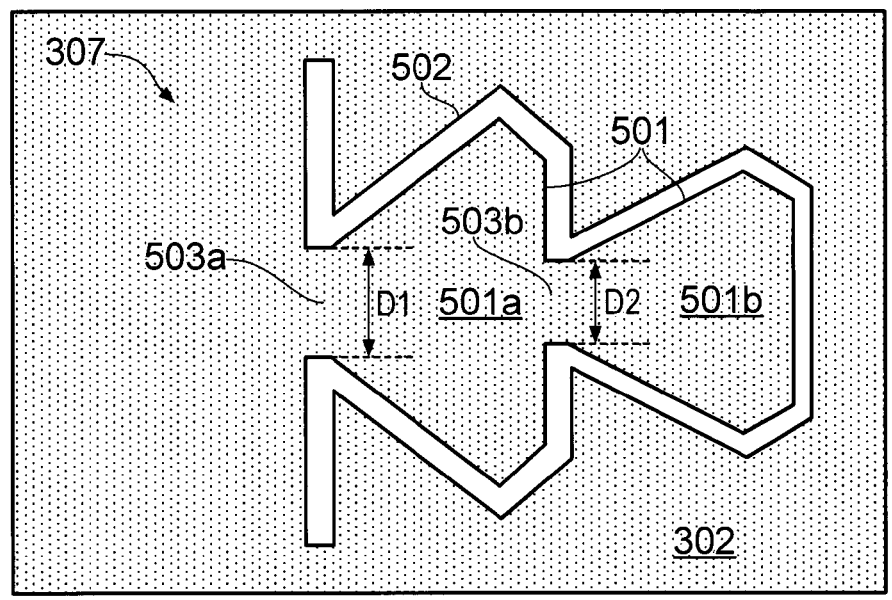
FIG. 5 illustrate one example of a variable vent that may be used in a transducer according to an embodiment.

FIG. 5 illustrates one example of such a variable vent structure 307 in plan view. In this embodiment at least one variable vent structure is formed in the inactive membrane region 302 and the flow path is thus a path through this part of the membrane, however other arrangements are possible. The variable vent structure may thus comprise a vent hole through the inactive membrane 302 and part of the membrane is formed as a moveable portion 501 which acts as a vent cover and which provides a variable degree of blocking of the hole, subject to the local pressure differential.

The moveable cover portion 501 is defined by at least one channel 502 which runs through the membrane. The channel 502, which may be formed by etching through the membrane material, is a thin channel and separates the moveable cover portion 502 from the rest of the membrane. Etching at least one channel 502 to partially separate the moveable cover portion 501 from the rest of the inactive membrane 302 in this way means that the moveable cover portion 501 may be deflected away from the surface of the rest of the membrane. Where the vent is formed in the inactive membrane region the moveable portion 501 of the vent may also be partly defined by the channel 304 discussed above which separates the active membrane 301 from the inactive membrane region 302.

In the embodiment of FIG. 5 the channel(s) 502 are configured not only to allow the cover portion 501 to be moveable with respect to the inactive membrane 302 but also to allow a section of the cover to be moveable with respect to another section of the cover.

Thus in the embodiment of FIG. 5 the moveable portion or vent cover 501 comprises a first flap portion 501a and also a second flap portion 302b. The first flap portion 501a is connected to the rest of the membrane 101 via a connecting region 503a. This connecting region is defined by the channel(s) 502 so as to have a shape and size which allows the first section 501a of the moveable cover to be deflected away from the membrane in response to a high enough pressure differential acting on the membrane. The connecting region 503a provides an effectively hinged connection between the first section 501a and the rest of the membrane, which defines the side wall of the vent hole through the membrane. It will be appreciated that the hinged connection is formed as a living hinge, i.e. formed from the same material as the membrane and first section 501a of the moveable cover, with the hinging being provided by removing material on either side of the connection such that the connection forms a neck portion. In this embodiment no special processing is required for the connection region itself to form the living hinge, i.e. the connecting region need not thinned or otherwise specially weakened. The connection is simply defined by the location of the channel(s) 502. This connecting region 503a thus allows for hinged, i.e. rotational, movement of the first section 501a of the cover 501 away from the rest of the membrane. It will be appreciated that in the embodiment of FIG. 5 the first section 501a of the moveable cover is thus effectively articulated to the rest of the membrane.

The second section 501b of the moveable cover is connected to the first section 501a by a connecting region 503b. This connecting region is also defined by the channel(s) 502 so as to have a shape and size which allows the second section 501b of the moveable cover to be deflected away from the first section 501a in response to a high enough pressure differential. The connecting region 503b may likewise provide a living hinge connection between the first section 501a and the second section 501b and likewise no special processing is required for the connection region 503b which likewise may form a neck portion. This connecting region 503b thus allows for rotational or pivotal, i.e. hinged movement of the second section 501b away from the first section 501a. It will be appreciated that in the embodiment of FIG. 5 the second section 501b of the moveable cover is thus effectively articulated to the first section 501a and is only connected to the rest of the membrane via the first section 501a.

Both the first and second sections 501a and 501b of the moveable cover portion 501 are preferably arranged such that their equilibrium positions, i.e. the positions that they adopt when there is no substantial pressure difference acting on the variable vent structure, are substantially within the plane of the inactive membrane 302. In other words, at equilibrium, the first section 501a of the cover 501 is not substantially deflected away from the rest of the membrane material and the second section 501b is not substantially deflected away from the first section 501a. Therefore, in equilibrium position the cover 501 substantially covers or blocks at least part of the flow path through the inactive membrane. In this embodiment the flow path is substantially completely closed at equilibrium position but in some embodiments the vent may be designed to provide a certain defined flow size at equilibrium.

It will of course be appreciated that the channel 502 does represent a path for air to flow through the membrane, however as like channel 304 discussed above, the channel 502 may be formed with a very narrow width and thus there may be no or limited air flow through the channel when the both sections 501a and 501b of the moveable cover 501 are in equilibrium position.

Whatever the design of the variable vents, and it will be appreciated that different vents in the same transducer may have different designs, at least some of the variable vents may be located in the inactive membrane regions 302. As mentioned this means that a desired venting performance can be achieved with fewer vents in the active membrane and possibly without any vents being provided in the active membrane 301.

When located in the inactive membrane region 302 any variable vents 307 should be preferably be positioned to provide a relatively direct flow path between the volumes on either side of the membrane when the vent opens.

As described previous in at least some embodiments the cavity 108 between the membrane layer 101 and the substrate may be defined accurately by using appropriately patterned sacrificial material. The substrate cavity 108 is etched to join up with this cavity 109 but, to avoid the less accurate back etch that forms the substrate cavity from defining the membrane the edges of the opening of the substrate cavity are within the area of the cavity 109. FIG. 3a illustrates the edge 308 of the opening of the substrate cavity. This means that in practice the periphery of the membrane, both the active 301 and the inactive regions 302, overlies a shelf of material, i.e. a substrate layer.

Conveniently the variable vents 307 are arranged so as to at least partly overlie the opening of the substrate cavity 108, in other words the vent is arranged so the flow path through the vent, when open, provides a path between the substrate cavity and the cavity on the other side of the membrane which is reasonable direct. FIG. 3a thus illustrates that for a variable vent structure with multiple hinged flap portions at least the end flap overlies the opening of the substrate cavity, i.e. extends inwards beyond the shelf or dog-leg formed by the substrate layers.

Figure 6:
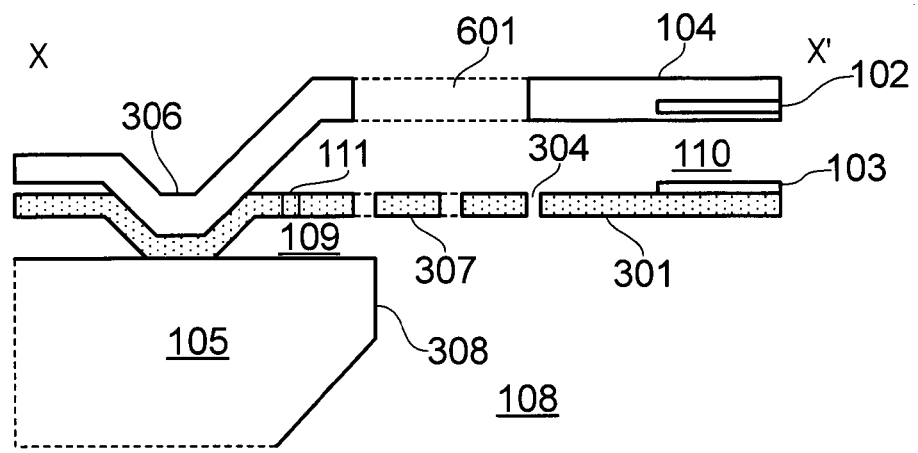
FIG. 6 illustrates a cross section of a transducer according to an embodiment.

FIG. 6 illustrates in cross section of a MEMS transducer according to the present invention. In particular this is a cross section of the membrane layer shown in FIG. 3a along the line X-X'. FIG. 6 also illustrate the back-plate 104 and substrate 105 (which may include the base substrate and one or more substrate layers formed thereon). As can be seen in FIG. 6, in this embodiment, the variable vent structures 307 are positioned over the cavity 108 to provide a direct flow path when open. This also allows them to open without colliding with any part of the substrate. In this embodiment, there is also a hole 601 in the back plate 104 which is positioned in the location where the variable vent 307 will open. The hole 601 may be one of the usual acoustic holes in the back-plate but in some embodiments may be a larger than typical hole. The hole 601 again allows a direct flow path between the front and back volumes in use when the vent is open and may provide a space for the variable vent to open into without unwanted contact with the back-plate.

FIGS. 3 and 6 also illustrate that at least some of the bleed holes 111 may be positioned in the inactive membrane region. Locating the bleed holes in the inactive region may provide similar benefits as discussed above in relation to the variable vent structures, i.e. the holes are not located in the active membrane 301 and thus do not affect the stresses or performance of the active membrane 301. Thus the design constraint for the bleed holes 111 may be relaxed compared to conventional designs. The bleed holes may however be located in the region of the inactive membrane 302 that overlies the shelf or dog-leg of the substrate layers 105, e.g. outside the area of opening of the substrate cavity. This means that the bleed holes do not provide a direct flow path between the front and back volumes and instead the flow path is tortuous. This reduces the impact of the bleed holes at acoustic frequencies whilst still allowing for the low frequency response.

FIG. 6 also illustrates one example of a form of the mounts 306 that may support the membrane layer 101. In this example the mount 306 comprises an area where the membrane layer makes contact with the substrate. In this example the backplate 104 also makes contact with the membrane layer 101 in the mount region. The membrane 101 in this area is thus held fixed between the substrate 105 and the backplate 306. The sloping side walls of this mount region help stress distribution and avoid delamination in use.

In the embodiment of FIG. 3a the active membrane comprises a plurality of arms with mounts 305. FIG. 3a illustrates one general mount structure extending laterally across the arm, in practice however it may typically be preferred to use a plurality of mounts.

Figure 7:
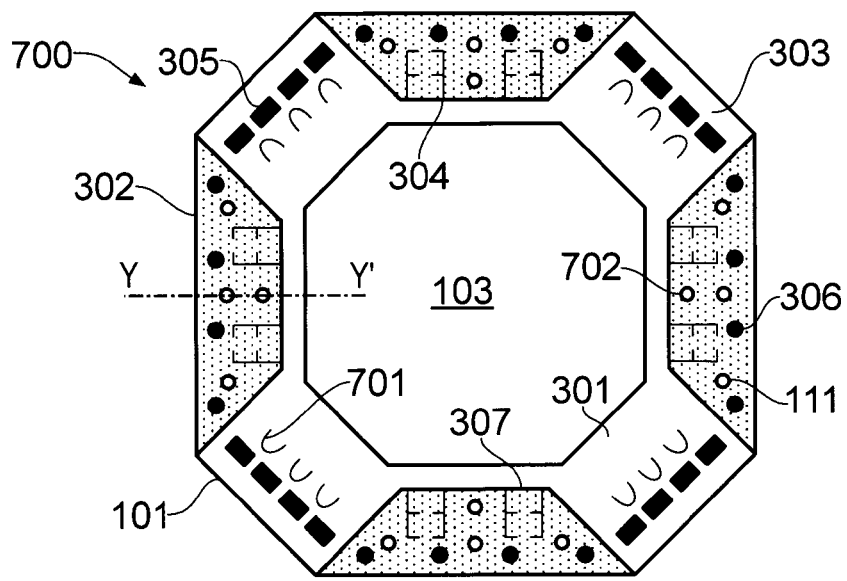
FIG. 7 illustrates another transducer structure according to an embodiment of the invention.

FIG. 7 illustrates a transducer according to an embodiment of the invention, where similar components to those identified in FIG. 3a are identified using the same reference numerals.

FIG. 7 illustrates the membrane in plan view. Again the whole area shown comprises membrane material with the membrane layer being divided into an area of active membrane 301 and inactive membrane regions 302 by channels 304. Again the active membrane may be supported by a plurality of arms 303 which may be evenly spaced around the active membrane.

In the example illustrated in FIG. 7 there are a plurality of mounts 305 for each arm. The mounts 305 may have the same general structure as set out above.

The mount structures 305 support the membrane layer in fixed relation to the substrate. As the mounts 305 are the innermost fixed part of the active membrane 301 they effectively define a peripheral edge of the flexible part of the active membrane 301. The mount structures 305 may be spaced apart from one another along the peripheral edge of the membrane.

As mentioned above the arm regions 303 support the active region of the membrane and there may be intrinsic stress in the membrane. Deflection of the membrane creates various additional stresses in the active membrane and the arm regions. In some embodiments therefore there may be one or more stress redistribution or stress diffusing structures 701 in the arm region 303 to avoid any undesirable concentration of stress in the arm region, and in particular at the mounts.

The stress redistribution structures may comprise curved or arcuate slits in membrane material. Each slit may be located within the flexible membrane with respect to a pair of adjacent mount structures 305 of an arm 303 so as to be located in front of a gap between the pair of mount structures, i.e. in a direction towards the centre of the membrane. The slits may be arranged such that any line on the membrane layer originating from the centre of the flexible membrane and passing through the gap between the adjacent mounts will intersect the slit. Each slit may describe a curved path that is concave with reference to the centre of the flexible membrane and which curves through at least 180°.

In some embodiments the slits may be generally U-shaped or C-shaped slits and are typically less than 1 μm wide. The stress redistribution slits change the distribution of the stress in the mounting end of the membrane, without significantly altering the acoustic properties of the active membrane. To alleviate any significant stress concentration in the active portion of the membrane, the slits are curved so as to provide a controlled redistribution of the stress.

It will be understood that high stresses at the mounting structures can potentially give rise to significant stresses within the active membrane. This is particularly a problem in the case of a relatively compact vent design, such as a design comprising a generally square or rectangular shaped membrane as shown in FIG. 3b, because the stresses caused by the mounting structures have a more significant effect on the properties of the proportionally higher. The provision of the stress redistribution slits advantageously serve to relax the stress in the vicinity of the mount region by partially disconnecting the membrane from the region of the mount structure. This may be seen to reduce the bending moment immediately in front of the mount. Furthermore, the flow lines of the stress arising through the region are changed and/or redistributed in the region of the mount and the flow lines of the stress are changed through this region.

It is generally known that holes may be provided in a membrane for stress relief. However, holes through the membrane provide a flow path and thus would result in a low acoustic conductance which would change the acoustic response of the membrane. The arcuate slits of this embodiment thus provide the benefits of stress redistribution or diffusion but without any significant increase in acoustic conductance. The slits could describe most of a circular path, however this would result in a narrow connecting region that connects the material within the slit with the rest of the membrane. This could provide a flap like structure similar to the moveable portions of the vents. The purpose of the slits 701 is different and venting is not necessarily useful in this area. The slits may therefore be designed so that the area within the slit does not substantially act as flap.

Figure 8A:
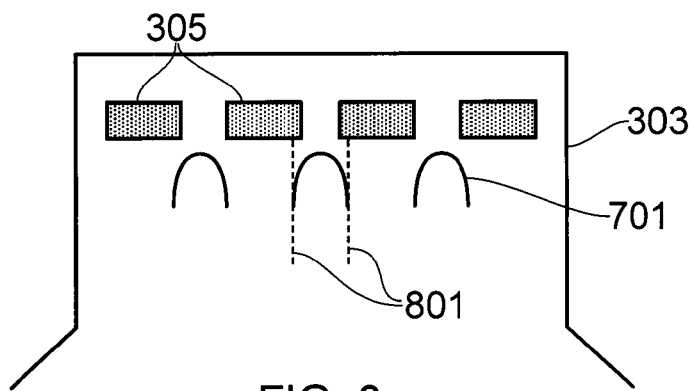
FIGS. 8a-8c illustrate various stress redistribution structures.

FIG. 8a illustrates the mounting end, i.e. an arm region 303, of an active membrane 301 according to an embodiment of the invention.

In this embodiment mounts 305 are dispersed along the periphery of the membrane. Four mounts 305 are illustrated in FIG. 8a but it will be appreciated that different numbers of mounts may be used in different embodiments. Stress redistribution slits 701 are positioned in front of the mounts. In this embodiment the slits are located such that for each of the gaps between the adjacent mount structures there is a corresponding slit 701 located in front in a direction towards the centre of the membrane. The slits in this embodiment are located in the arm region 303 and each slit has a width at least as large as the relevant gap. The slits are generally curved through an angle of the order of 180° or more.

These U-shaped slits 701 may be arranged such that two distinct and parallel tangents, illustrated by dashed lines 801, can be drawn to the path of each slit which will intersect both the mount structures which the slit is positioned in front of. It will be appreciated that different shapes of slits may be used and/or the slits may be positioned differently.

Figure 8B:
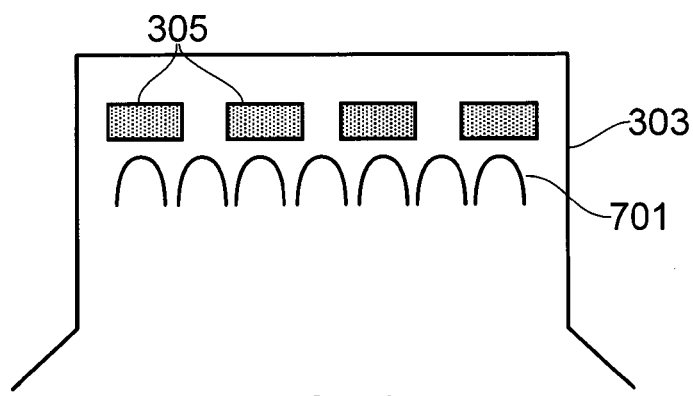
Figure 8C:
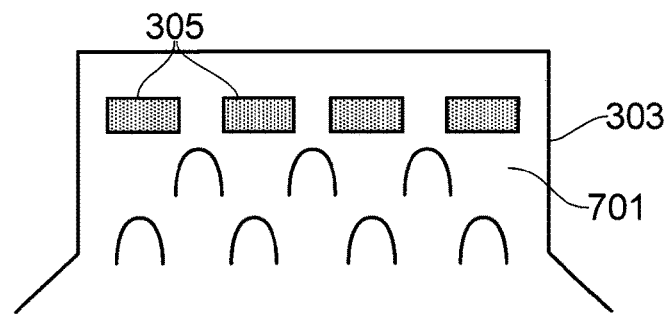

It will be appreciated that more slits could be added to further improve the distribution of stress. For example, additional slits could be added between the slits 701 already present in FIG. 8a. Such an embodiment is illustrated in FIG. 8b. In this embodiment at least some of the stress redistribution slits may be located substantially completely in front of a mount 305, in a direction towards the centre of the active membrane. Alternatively or additionally, another layer of slits, which in this example is staggered, could be added closer to the centre of the membrane, as shown in FIG. 8c.

Such stress redistribution slits are particularly useful for the embodiments described where an active membrane 301 is supported by distinct arms 303. However the principles could equally well be applied to the conventional transducer structure illustrated in FIGS. 1a and 1b where a continuous membrane is supported by a plurality of mount structures all around the periphery of the membrane.

The stress redistribution slits thus allow an embodiment with an active membrane 301 to be implemented without an undue concentration of stress in the arm regions 303, which may be the inherent stress of the membrane layer 101 and/or may be stressed induced on deflection of the active membrane.

Referring back to FIG. 7 in this embodiment the shape of the membrane electrode 103 is conformal to the general shape of the membrane. In other words the perimeter of the membrane electrode 103 may be non-circular in shape. In this embodiment the perimeter of the membrane electrode 103 encompassed a substantial proportion of the inner part of the active membrane 301, i.e. the region inside the arm regions 303. Providing the membrane over such a relatively wide extent may help provide good sensitivity. In this embodiment no variable vents or bleed holes may be needed in the active membrane and thus the electrode can extend over this area without a need to leave spaces for such features. In some embodiments the membrane electrode 103 may be substantially continuous over the whole of the area within the membrane material. In some embodiments however there may be areas devoid of electrode material within the periphery of the membrane, e.g. there may be a plurality of holes within the membrane electrode.

A metallic material used for the membrane electrode may exhibit a degree of plastic deformation when the membrane is deflected due to incident acoustic pressure waves. This can, in some instances, lead to a gradual permanent deformation of the membrane at equilibrium position and lead to an unwanted offset or loss of sensitivity. Using less metal can reduce this problem but generally is considered to reduce sensitivity. It is appreciated however that there are holes in the backplate electrode due to the presence of the acoustic holes 112. The sensitivity of the transducers is mainly affected by the amount of overlap of the membrane and backplate electrodes and thus it has been appreciated that membrane electrode material can be omitted in the location corresponding to the backplate acoustic holes without a significant impact on sensitivity.

Figure 9:
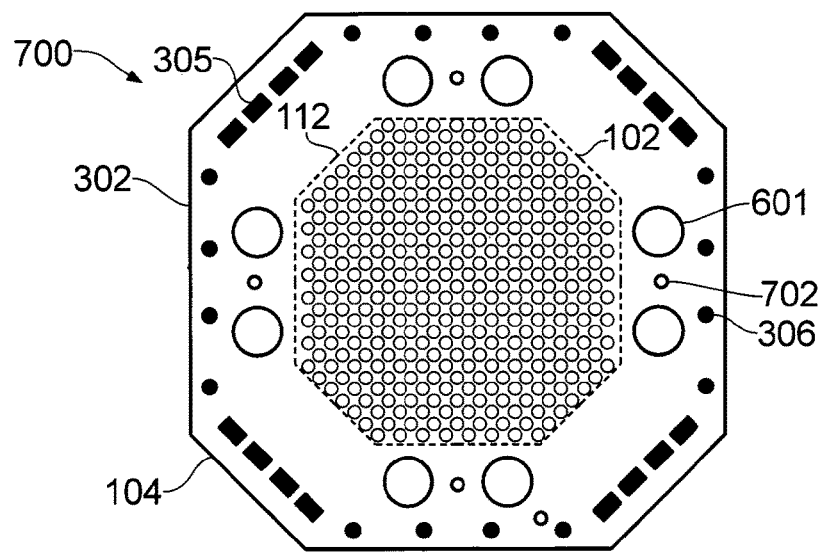
FIG. 9 illustrates the backplate of a transducer in plan view.

In some embodiments the elements of the backplate may additionally or alternatively be conformal to the general transducer shape. For example FIG. 9 illustrates a backplate 104 of the transducer 700 in plan view. In this embodiment the backplate is supported by the same mount structures 305 and 306 as the membrane. The perimeter of the backplate electrode 102 is also illustrated by the dashed line and may correspond to the shape of the backplate electrode and/or the general shape of the transducer, e.g. the shape of the inner part of the active membrane, i.e. that part of the active membrane supported by the arm portions 303.

FIG. 9 also illustrates that the acoustic holes 112 through the backplate may be conformal with active membrane and thus may for instance be formed in an area with a shape that generally corresponds to the part of the active membrane supported by the arm portions 303.

FIG. 9 also illustrates that larger holes may be located to correspond with the location of vents 307.

In such an embodiment any incident sound waves received via the backplate will thus substantially be incident on the active membrane 301.

It will be appreciated from the discussion above that the inactive membrane regions 302 may be formed from the same material as the active membrane 301. In response to a pressure differential there may therefore be a degree of deflection of the inactive membrane.

Whilst there may not be a problem with such limited deflection of the inactive membrane in some embodiments there may be at least one support element connecting between the inactive membrane and either or both of the substrate or backplate. This support element, which should be located outside of the area of any variable vent, may prevent significant movement of the inactive membrane but may have no impact on the active membrane.

Figure 10:
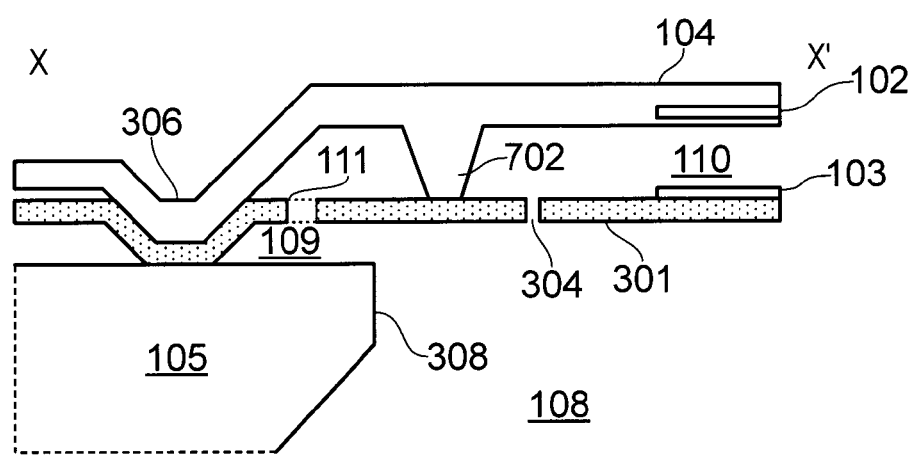
FIG. 10 illustrates a cross section of a transducer according to another embodiment.

FIGS. 7 and 9 illustrate that there may be such a support element 702 that connects from the backplate to near the inner edge of inactive membrane 302. FIG. 10 illustrates a cross section through the line Y-Y' shown in FIG. 7.

One or more transducers according to the any of the embodiments described above may be incorporated in a package. FIGS. 11a to 11g illustrate various different packaging arrangements. FIGS. 11a to 11g each show one transducer element located in the package but it will be appreciated that in some embodiments there may be more one than transducer, e.g. a transducer array, and the various transducers may be formed on the same transducer substrate, i.e. a monolithic transducer substrate, or may be formed as separate transducers with separate transducer substrates each separate transducer substrate being bonded to a package substrate.

Figure 11A:
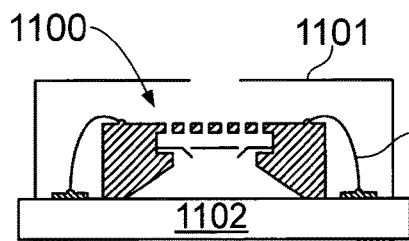
FIGS. 11a to 11h illustrate various MEMS transducer packages.

FIG. 11a shows a first arrangement where a transducer 1100 is located in a cover 1101, which forms at least part of a housing, on a package substrate 1102. The cover in this example could be a metallic housing which is bonded to the substrate. The package substrate may comprise at least one insulating layer. The package substrate may also comprise at least one conductive layer. The package substrate may be a semiconductor material or may be formed from a material such as PCB, ceramic or the like. Where the cover 1101 is metallic, or itself comprises a conductive layer, the cover may be electrically coupled to the conductive layer of the substrate, e.g. so that the housing provides shielding for electromagnetic interference (EMI). Bond wires 1103 may connect the transducer to bond pads on the package substrate. In some embodiments, read-out circuitry, for instance amplifier circuitry, may be located within the housing formed in or connected to the package substrate. Through-vias through the package substrate (not illustrated) may connect to contacts, i.e. solder pads, 1104 for electrically connecting external circuitry (not illustrated) to the package to allow transmission of electrical signals to/from the transducer 1100. In the example shown in FIG. 11a there is a sound port or acoustic port in the cover 1101 to allow sound to enter the package and the transducer is arranged in a top port arrangement.

Figure 11B:
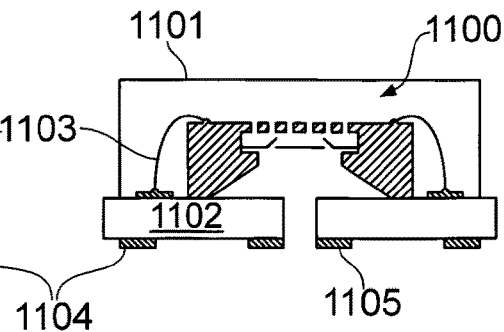

FIG. 11b illustrates an alternative arrangement where the sound port is provided in the package substrate 1102 and may, in use, be sealed. A ring 1105, which may be a sealing ring or a solder pad ring (for use in forming a solder ring) may be provided around the periphery of the sound port on the outer side of the package to allow, in use, sealing of a sound path leading to the sound port when the package is connected to another PCB for example. In this embodiment the transducer is arranged in a bottom port arrangement with the volume defined by the housing 1101 forming part of the back-volume of the transducer.

Figure 11C:
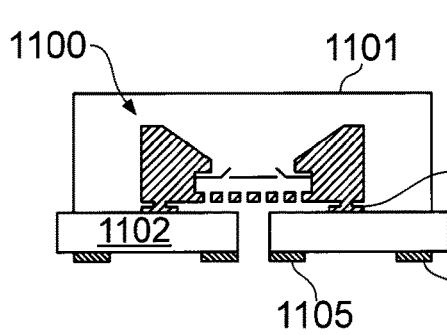

FIG. 11c illustrates an example where instead of bond wires connecting the transducer to the package substrate the transducer structure is inverted and flip-chip bonded to package substrate via connections 1106. In this example the sound port is in the package substrate such that the package is arranged in a bottom port arrangement.

Figure 11D:
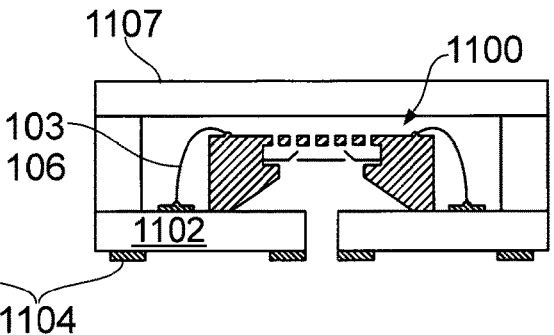
Figure 11E:
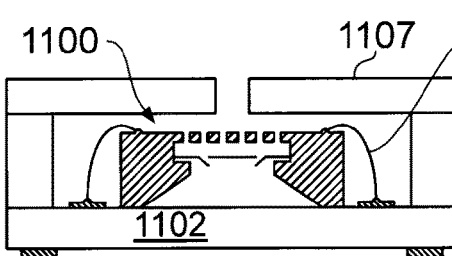
Figure 11F:
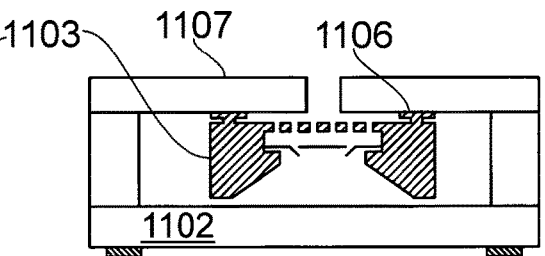
Figure 11G:
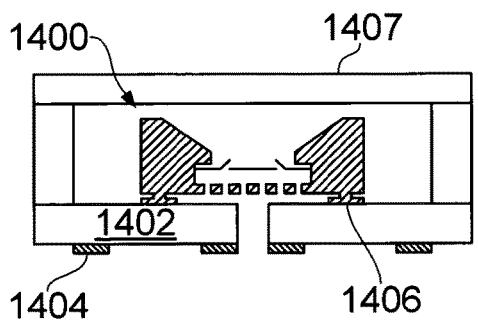

FIG. 11d illustrates an alternative example to that of FIG. 11b wherein a housing 1107 is formed from various panels of material, for example PCB or the like. In this instance the housing 1107 may comprise one or more conductive layers and/or one or more insulating layers. FIG. 11d shows the sound port in the package substrate. FIG. 11e shows an alternative arrangement to that of FIG. 11b wherein a housing 1107 is formed from various panels of material, for example PCB or the like as described in relation to FIG. 11d. FIG. 11f shows a further embodiment where the transducer structure is bonded via connections 1106 to the housing upper layer, which may for instance be PCB or layered conductive/insulating material. In this example however the electrical connections to the package are still via contacts, solder pads, 1104 on the package substrate, e.g. through-vias (not illustrated) in the package substrate with conductive traces on the inside of the housing to the transducer. FIG. 11g illustrates an alternative example to that of FIG. 11c wherein a transducer is flip-chip bonded to the package substrate in a housing 1107 formed from panels of material, for example PCB or the like as described in relation to FIG. 11d.

Figure 11H:
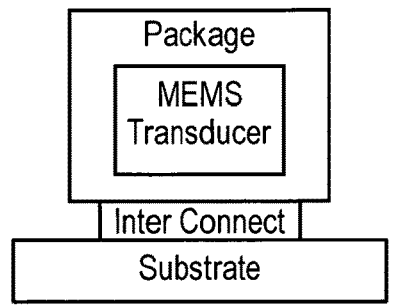

In general, as illustrated in FIG. 11h, one or more transducers may be located in a package, the package is then operatively interconnected to another substrate, such as a mother-board, as known in the art.

Although the various embodiments describe a MEMS capacitive microphone, the invention is also applicable to any form of MEMS transducers other than microphones, for example pressure sensors or ultrasonic transmitters/receivers.

Embodiments of the invention may be usefully implemented in a range of different material systems, however the embodiments described herein are particularly advantageous for MEMS transducers having membrane layers comprising silicon nitride.

Although the various embodiments above have been described with respect to a MEMS capacitive microphone, the invention is also applicable to any form of MEMS transducers other than microphones, for example pressure sensors or ultrasonic transmitters/receivers.

Embodiments of the invention may be usefully implemented in a range of different material systems, however the embodiments described herein are particularly advantageous for MEMS transducers having membrane layers comprising silicon nitride.

The MEMS transducer may be formed on a transducer die and may in some instances be integrated with at least some electronics for operation of the transducer. In the embodiments described above it is noted that references to a transducer element may comprise various forms of transducer element. For example, a transducer element may comprise a single membrane and back-plate combination. In another example a transducer element comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprises different individual transducers positioned to receive acoustic signals from different acoustic channels.

It is noted that in the embodiments described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes. However, it is noted that the embodiments are also intended to embrace the output signal being derived by monitoring piezo-resistive or piezo-electric elements or indeed a light source. The embodiments are also intended embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It is noted that the embodiments described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, wearable devices, laptops, mobile phones, PDAs and personal computers. Embodiments may also be used in voice activated or voice controlled devices. Typical medical applications include hearing aids. Typical industrial applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A MEMS transducer comprising a membrane and at least two mount structures provided at or near a periphery of the membrane to for supporting the membrane relative to a substrate and to provide a flexible membrane, wherein:
the flexible membrane comprises at least one slit which extends through the membrane, each slit describing a path that is concave with reference to a center of the flexible membrane and which curves through at least 180 degrees so as to define a mouth between the ends of the at least one slit which faces away from a gap between two adjacent mount structures of the at least two mount structures; and
the at least one slit is located at a region in front of the gap between the two adjacent mount structures in a direction towards a center of the membrane.

2. The MEMS transducer as claimed in claim 1, wherein the slit is C-shaped or U-shaped.

3. The MEMS transducer as claimed in claim 1, the membrane comprising a central region and plurality of stress distributing arms which extend laterally from the central region, wherein each stress distributing arm comprises at least two of said mount structures.

4. The MEMS transducer as claimed in claim 3, wherein the stress distributing arms are spaced evenly around the central region of the membrane.

5. The MEMS transducer as claimed in claim 3, wherein the central region and the plurality of stress distributing arms form a first region of the membrane and wherein the membrane further comprises a second region.

6. The MEMS transducer as claimed in claim 5, wherein the transducer comprises an electrode which is coupled to the first region of the membrane.

7. The MEMS transducer as claimed in claim 5, further comprising at least one vent structure provided in the second region of the membrane.

8. The MEMS transducer as claimed in claim 1, wherein the membrane is generally square or rectangular in shape.

9. The MEMS transducer as claimed in claim 1, wherein the membrane comprises:
an active membrane region, the active region comprising a plurality of arms for supporting the active membrane region; and
a plurality of inactive membrane regions which are not directly connected to the active membrane region.

10. The MEMS transducer as claimed in claim 9, wherein the arms of the active membrane region comprise one or more mounts.

11. The MEMS transducer as claimed in claim 10 wherein the mounts of each arm being substantially equidistant from the center of the active membrane.

12. The MEMS transducer as claimed in claim 9, wherein the transducer comprises at least one variable vent structure formed in the membrane layer wherein the active membrane region does not comprise any variable vent structure.

13. A MEMS transducer structure comprising:
a membrane layer supported relative to a substrate to provide a flexible membrane,
a first plurality of mount structures for supporting the membrane layer in fixed relation to the substrate, the first plurality of mount structures being configured to define a peripheral edge of the flexible membrane and being spaced apart from one another along the peripheral edge of the flexible membrane; and
a first plurality of stress diffusing slits in said membrane layer;
wherein each stress diffusing slit is located within the flexible membrane in front of a gap between adjacent mount structures of the first plurality of mount structures in a direction towards a center of the flexible membrane; and
each stress diffusing slit being elongate and having a curved path such that a first tangent in a plane of the membrane layer to a first part of the path of the stress diffusing slit intersects with one of said adjacent mount structures and a second tangent in the plane of the membrane layer to a second part of the path of the stress diffusing slit intersects with the other of said adjacent mount structures, where the first and second tangents are parallel.

14. The MEMS transducer structure as claimed in claim 13 wherein said tangents are perpendicular to a peripheral edge defined by the first plurality of mount structures.

15. The MEMS transducer structure as claimed in claim 14 wherein the peripheral edge defined by the first plurality of mount structures is defined by a line running along a front of the first plurality of mount structures.

16. The MEMS transducer structure as claimed in claim 13 wherein said tangents are parallel to first axis between the center of flexible membrane and the center of a base line between the adjacent mount structures.

17. A MEMS transducer structure comprising:
a membrane layer supported relative to a substrate to provide a flexible membrane,
a first plurality of mount structures for supporting the membrane layer in fixed relation to the substrate, the first plurality of mount structures being configured to define a peripheral edge of the flexible membrane and being spaced apart from one another along the peripheral edge of the flexible membrane; and
a first plurality of stress diffusing slits in said membrane layer;
wherein each stress diffusing slit is located within the flexible membrane with respect to a pair of adjacent mount structure of the first plurality of mount structures so as to be located in front of a gap between the pair of mount structures in a direction towards the center of a flexible membrane such that any line on the membrane layer originating from the center of the flexible membrane and passing through said gap will intersect said stress diffusing slit; and
wherein said stress diffusing slit describes a curved path that is concave with reference to the center of the flexible membrane and which curves through at least 180° so as to define a mouth between the ends of the stress diffusing slit which faces away from the gap between the two adjacent mount structures.

* * * * *

UNITED STATES PATENT AND TRADEMARK OFFICE
CERTIFICATE OF CORRECTION

PATENT NO. : 10,343,901 B2
APPLICATION NO. : 15/543492
DATED : July 9, 2019
INVENTOR(S) : Cargill et al.

It is certified that error appears in the above-identified patent and that said Letters Patent is hereby corrected as shown below:

In the Claims

Please amend Claim 12 as follows:
12. The MEMS transducer as claimed in claim 9, wherein the transducer comprises at least one variable vent structure formed in the membrane wherein the active membrane region does not comprise any variable vent structure.

Signed and Sealed this
Tenth Day of December, 2019

Andrei Iancu
*Director of the United States Patent and Trademark Office*